US005446368A

United States Patent [19]
[11] Patent Number: 5,446,368

Uscategui
[45] Date of Patent: Aug. 29, 1995

[54] VOLTAGE INDEPENDENT SYMMETRICAL CURRENT SOURCE WITH CROSS-COUPLED TRANSISTORS

[75] Inventor: Gabriel J. Uscategui, Palm Bay, Fla.

[73] Assignee: Harris Corporation, Melbourne, Fla.

[21] Appl. No.: 180,666

[22] Filed: Jan. 13, 1994

[51] Int. Cl.[6] .......... G05F 3/16; H03F 3/45

[52] U.S. Cl. .......... 323/315; 330/257

[58] Field of Search .......... 323/312, 315, 316, 317; 330/133, 257, 288, 296; 307/296.1, 296.6

[56] References Cited

U.S. PATENT DOCUMENTS

| | | | |
|---|---|---|---|
| 4,479,086 | 10/1984 | Nagano | 323/315 |
| 4,682,098 | 7/1987 | Seevinck et al. | 323/315 |
| 4,947,103 | 8/1990 | Abdi et al. | 323/316 |
| 4,958,122 | 9/1990 | Main | 323/315 |
| 4,988,954 | 1/1991 | Stern et al. | 330/264 |
| 5,049,653 | 9/1991 | Smith et al. | 330/267 |
| 5,113,147 | 5/1992 | Klein | 330/257 |

OTHER PUBLICATIONS

"Analysis and Design of Analog Integrated Circuits," 2nd Edition, Paul R. Gray and Robert G. Meyer, 1977, pp. 233–237.

*Primary Examiner*—Steven L. Stephan
*Assistant Examiner*—Matthew V. Nguyen
*Attorney, Agent, or Firm*—Nixon, Hargrave, Devans & Doyle

[57] ABSTRACT

A symmetrical current source 10 has a pnp current source 11 including four npn transistors Q1-Q4 and a pnp output transistor Q28 and an npn current sink 12 including pnp transistors Q5-Q8 and an output transistors Q29. In current source 11 cross coupled transistors Q3, Q4 establish a predetermined bias for source 11; cross coupled transistors Q7, Q8 establish a predtermined bias for sink 12.

20 Claims, 3 Drawing Sheets

VOLTAGE INDEPENDENT SYMMETRICAL CURRENT SOURCE WITH CROSS-COUPLED TRANSISTORS

BACKGROUND

Transistor current sources are widely used in integrated circuits as biasing elements and as load devices :for amplifier stages. The purpose of a current source in biasing is to provide a source of current that is insensitive to power supply variations and to changes in temperature. Such current sources may be implemented in bipolar transistor processes as well as in metal oxide semiconductor processes.

A typical bipolar current source is shown in FIG. 1. A pair of npn transistors are configured in a typical current source arrangement. The bases of the transistors Q1, Q2 are tied together and the transistor Q1 has its collector coupled to its base. A positive power supply $V_{cc}$ provides a voltage to the transistors Q1 via a resistor R. The current $I_{c2}$ that flows in the collector of transistor Q2 will be approximately equal to the current $I_{c1}$ in transistor Q1. The circuit of FIG. 1 is discussed in more detail in "Analysis and Design of Analog Integrated Circuits," 2nd Edition, Paul R. Gray and Robert G. Meyer, 1977, pages 233–237.

FIG. 2 shows an improvement over the current source of FIG. 1. In FIG. 2, an npn transistor source consisting of transistors Q1, Q2 is set at a predetermined voltage bias level. It is set at that predetermined voltage bias level by transistors Q3 and Q4. Transistors Q3 and Q4 are base-collector crosscoupled. Then, the current flowing through a diode Q25 is mirrored to provide a current sink for npn transistors. The current sink is provided by current $I_n$ that flows through transistor Q29. Transistor Q29 mirrors the current $I_n$ through diode Q25 via transistor Q26 and diode Q27. Current is separately supplied to the pnp transistors through transistor Q28. Thus, the circuit in FIG. 2 provides a current source $I_p$ for the pnp transistors and a current sink $I_n$ for npn transistors.

However, the circuit of FIG. 2 is not symmetrical and does include current mirroring twice. For this reason, the currents $I_p$ and $I_n$ are not as precisely symmetrical as desired in precision amplifiers. As a result of the mirroring, an Early voltage error is introduced and that error together with beta errors of the transistors requires additional transistors to modify the current source and achieve symmetrical current sources for npn and pnp transistors.

SUMMARY OF THE INVENTION

The invention provides a symmetrical current source which provides substantially the same or proportionately related current for both npn and pnp transistors. The symmetrical current source provides an npn current source with cross coupled npn transistors to maintain a predetermined npn bias voltage and a pnp current sink with cross coupled pnp transistors to maintain a predetermined pnp transistor bias voltage. The inventive circuit is deemed symmetrical since four npn transistors and one pnp transistor are used to provide the pnp transistor source and for pnp transistors and one npn transistor are used to provide and npn current sink. The pnp transistor current source includes the first and second npn transistors that are configured as a first transistor current source. The first transistor current source includes first and second npn transistors. The first and second npn transistors have their bases coupled together. The first transistor has its collector shorted to the base and coupled to a positive reference voltage via a second resistor. The second npn transistor has its collector coupled to a positive reference voltage source via the first diode. The emitters of the first and second npn transistors are coupled to the collectors of cross coupled third and fourth npn transistors. The cross coupled third and fourth npn transistors have the base of one transistor coupled to the collector of the other. Such a configuration provides a predetermined diode drop for the first transistor current source. A fifth or output npn transistor is coupled to the collector of the second npn transistor. This output pnp transistor provides the supply current for other pnp transistors downstream from the current source.

The second current source includes first and second pnp transistors which likewise have there bases coupled together and one of them with a collector shorted to the base. The second transistor current source is likewise coupled to a third and fourth pnp cross coupled transistors. The emitters of the first and second pnp transistors are coupled to the collectors of the third and fourth pnp transistors, respectively. The third and fourth pnp transistors are base/collector cross coupled to each other. These cross coupled transistors provide a predetermined two diode voltage drop with respect to a negative reference voltage source. A third resistance couples the collector of the first pnp transistor to a negative reference voltage. The collector of the second pnp transistor is coupled to a negative referenced voltage via a second diode. An output fifth npn transistor is coupled between the negative reference voltage source and the collector of the second pnp transistor. The fifth or output npn transistor provides a current sink for all other npn transistors downstream from the symmetrical current source.

The symmetrical current source may also be implemented in mos technology wherein nmos transistors are substituted for npn transistors and pmos transistors are substituted for pnp transistors.

DETAILED DESCRIPTION

Figure 1:
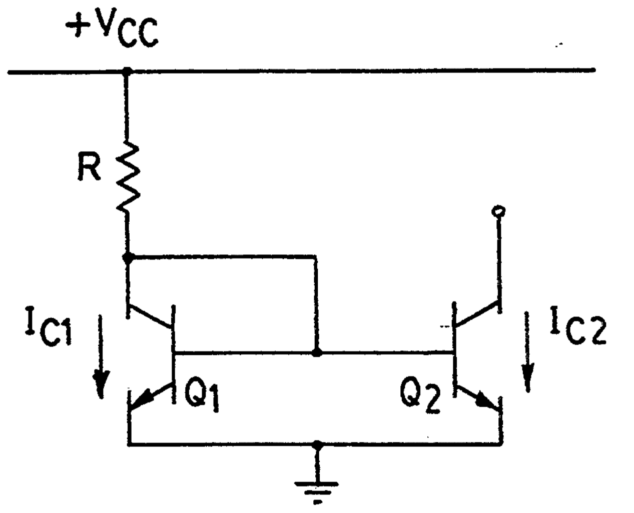
FIG. 1 PRIOR ART
FIG. 1 (Prior Art) shows a current source.
Figure 2:
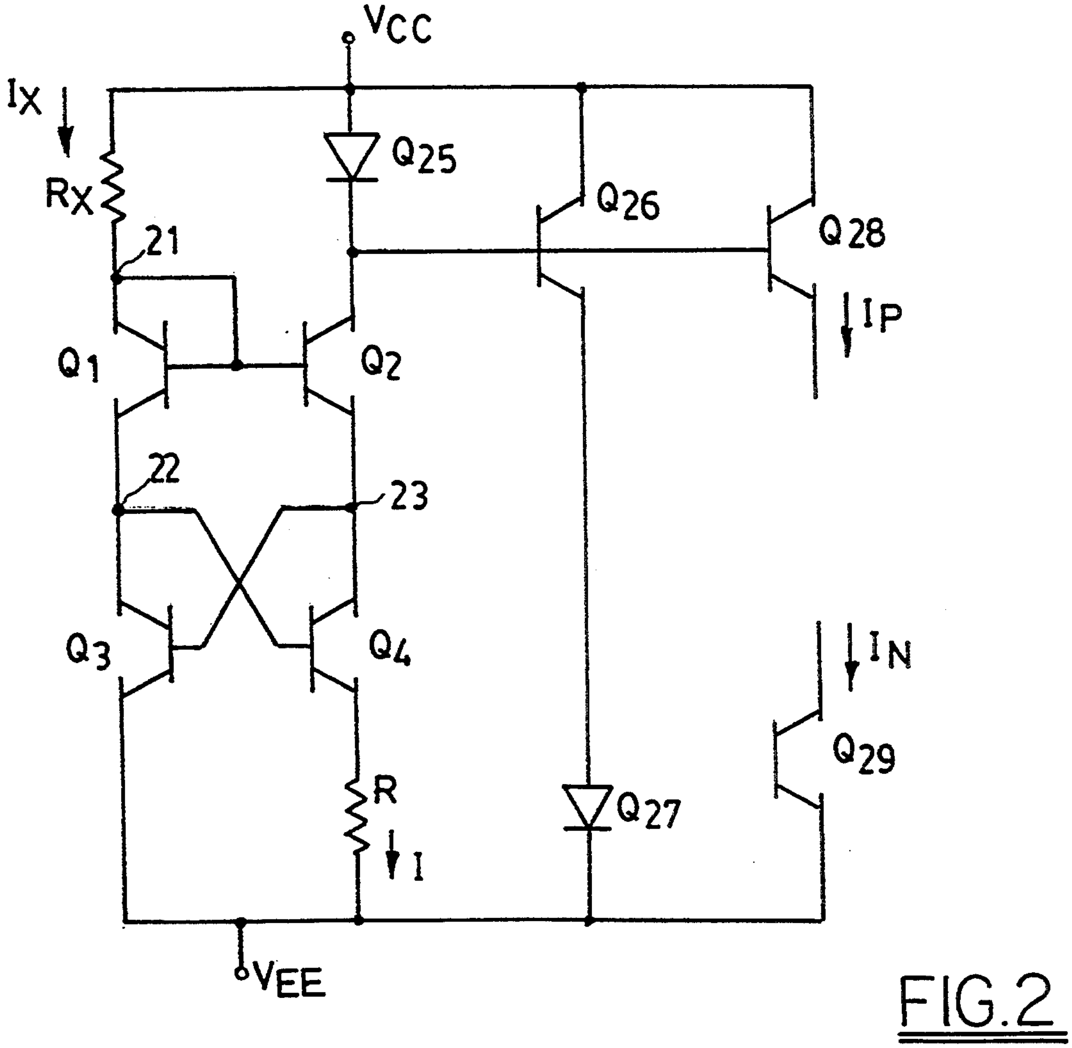
FIG. 2 PRIOR ART
FIG. 2 (Prior Art) shows a current source with cross coupled biasing.
Figure 3:
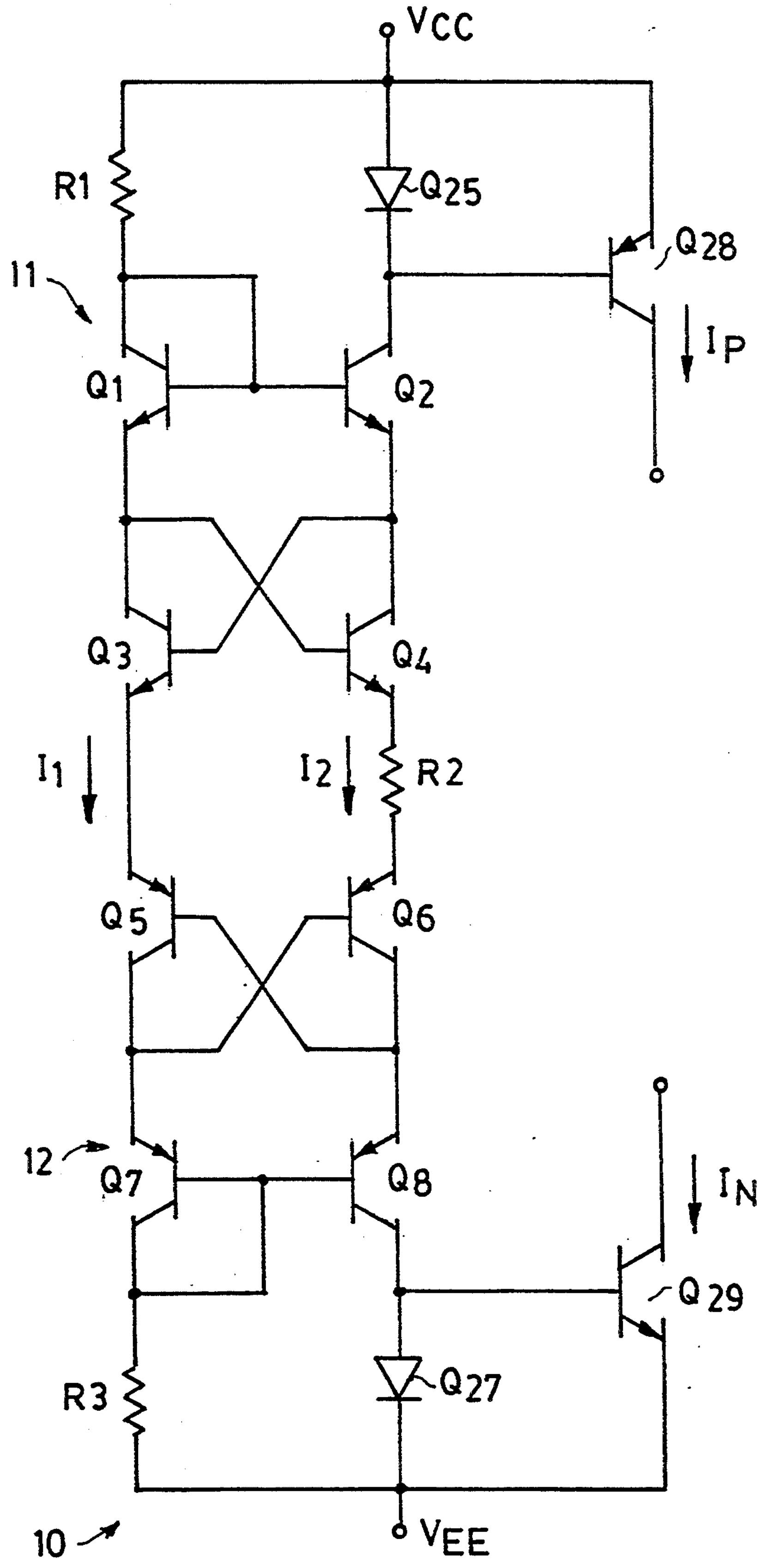
FIG. 3 shows a symmetrical bipolar current source.

With reference to FIG. 3, there is shown symmetrical current source 10. A first transistor current source 11 includes npn transistors Q1-Q4. A second current source 12 includes pnp transistors Q5-Q8. The output of the first transistor current source 11 is provided at a first output pnp transistor Q28 which provides a current source for all pnp transistors downstream from the symmetrical current source 10. The second current source 12 has a second output transistor, Q29, an npn transistor which provides the current sink for all downstream npn transistors. The symmetrical current source 10 is coupled between a positive reference voltage of $V_{cc}$ and a negative reference voltage $V_{ee}$. In a typical implementation, the $V_{cc}$ source is approximately +15 volts and the $V_{ee}$ source is approximately −15 volts. The first transistor current source 11 has third and fourth npn transistors Q3, Q4 that are cross coupled to each other. In this regard, the base of Q4 is coupled to the collector of Q3 and the base of Q3 is coupled to the collector of Q4. This particular connection in combination with the first and second transistors Q1, Q2, provides a predetermined bias voltage for transistors Q1 and Q2.

The emitter of transistor Q4 is coupled via a resistor R2 to the emitter of transistor Q6. The emitter of transistor Q3 is coupled to the emitter of transistor Q5. A current $I_1$ flows from the emitter of Q3 into the emitter of Q5. A current $I_2$ flows from the emitter of Q4 through resistor R2 and into the emitter of Q6. Resistors R1 and R3 are coupled with the collectors of Q1 and Q7, respectively, to their reference voltage sources. Diodes Q25 and Q27 likewise couple the collectors of transistors Q2, Q8 to their respective reference voltage sources.

It is a feature of the current source 10 that the current $I_2$ following through resistor R2 is independent of the current $I_1$ and is only dependent upon the geometry of the emitters of transistors Q1-Q8. The independence of the current $I_2$ from the current $I_1$ can be determined from the following derivation. Consider a voltage path beginning at the base of transistor Q1 proceeding through the emitter of Q1 to the base of Q4, from the emitter of Q4 through resistor R2, through the emitter of Q6 to the emitter of Q7. That voltage drop will equal the same voltage along a closed loop that consists of the path through the base-emitter junction of Q8, the base-emitter junction of Q5, the base-emitter junction of Q3, and the base-emitter junction of Q2. Thus, the voltage loop Equation is as follows: EQ 1:

$$V_{BE1}+V_{BE4}+IR+V_{BE6}+V_{BE7}=V_{BE8}+V_{BE5}+-V_{BE3}+V_{BE2}$$

The above equation can be simplified since it is known that the voltage across the base-emitter junction of a transistor is a function of the current through the emitter and the geometry of the transistor. This relationship is shown in Equation 2:

EQ 2:

$$V_{BE}\simeq\frac{kt}{q}\ln\frac{I_E}{A_E J_S}$$

where $A_E$ is the area of the emitter diffusion Since the current through transistors Q1, Q3, Q5 and Q7 is $I_1$ and the current through transistors Q2, Q4, Q6 and Q8 is $I_2$, then, so long as the beta of all the transistors is high and approaches infinity, the expression for equation 2 can be substituted into the terms of Equation 2 to yield the following result:

EQ 3:

$$\frac{kT}{q}\ln\frac{I_1}{A_1 J_{SN}}+\frac{I_2}{A_4 J_{SN}}+\frac{I_2}{A_6 J_{SP}}+\frac{I_1}{A_7 J_{SP}}+I_2R_2=$$

$$\frac{kT}{g}\ln\frac{I_2}{A_8 J_{SP}}+\frac{I_1}{A_5 J_{SP}}+\frac{I_1}{A_3 J_{SP}}+\frac{I_2}{A_2 J_{SN}}$$

Those skilled in the art will realize that the terms in the above equation can be collected as the products of natural logarithms since the sum of logarithms of two or more terms if equal to the logarithm of the product of those terms. In other words: EQ 4:

$$\ln A+\ln B=\ln(A\ \ B)$$

Collecting the terms of EQ 3 yields the following:

EQ 5:

$$I_2R_2=\frac{kT}{q}\ln\frac{I_2{}^2I_1{}^2}{A_8A_5A_3A_2J_{SN}^2J_{SN}^2}+\frac{A_1A_4A_6A_7J_{SN}^2J_{SP}^2}{I_2{}^2I_1{}^2}$$

After cancelling like terms between the numerator and denominator, the final result is that the current $I_2$ is determined by the following relationship:

EQ 6:

$$I_2=\frac{kT}{qR_2}\ln\frac{A_1A_4A_6A_7}{A_8A_5A_3A_2}$$

Thus, the current $I_2$ is independent of the referenced current $I_1$. In addition, if the temperature coefficient of the resistor $R_2$ approximates the kT/q value of equation 6, then $I_2$ will be insensitive to changes in temperature.

In addition, the impedance looking into the collector of Q2 or Q8 can be represented as follows:

EQ 7:

$$Z_{C2}\approx\frac{1}{hsb_N+\frac{\partial_N hrb_N}{R+hib}}\approx\frac{R_2+hib}{\partial_N hrb_n}$$

EQ 8:

$$Z_{C8}\approx\frac{1}{hsbp+\frac{\partial_p hrb_p}{R_2+hib}}\approx\frac{R_2+hib}{\partial_p hrb_p}$$

Figure 4:
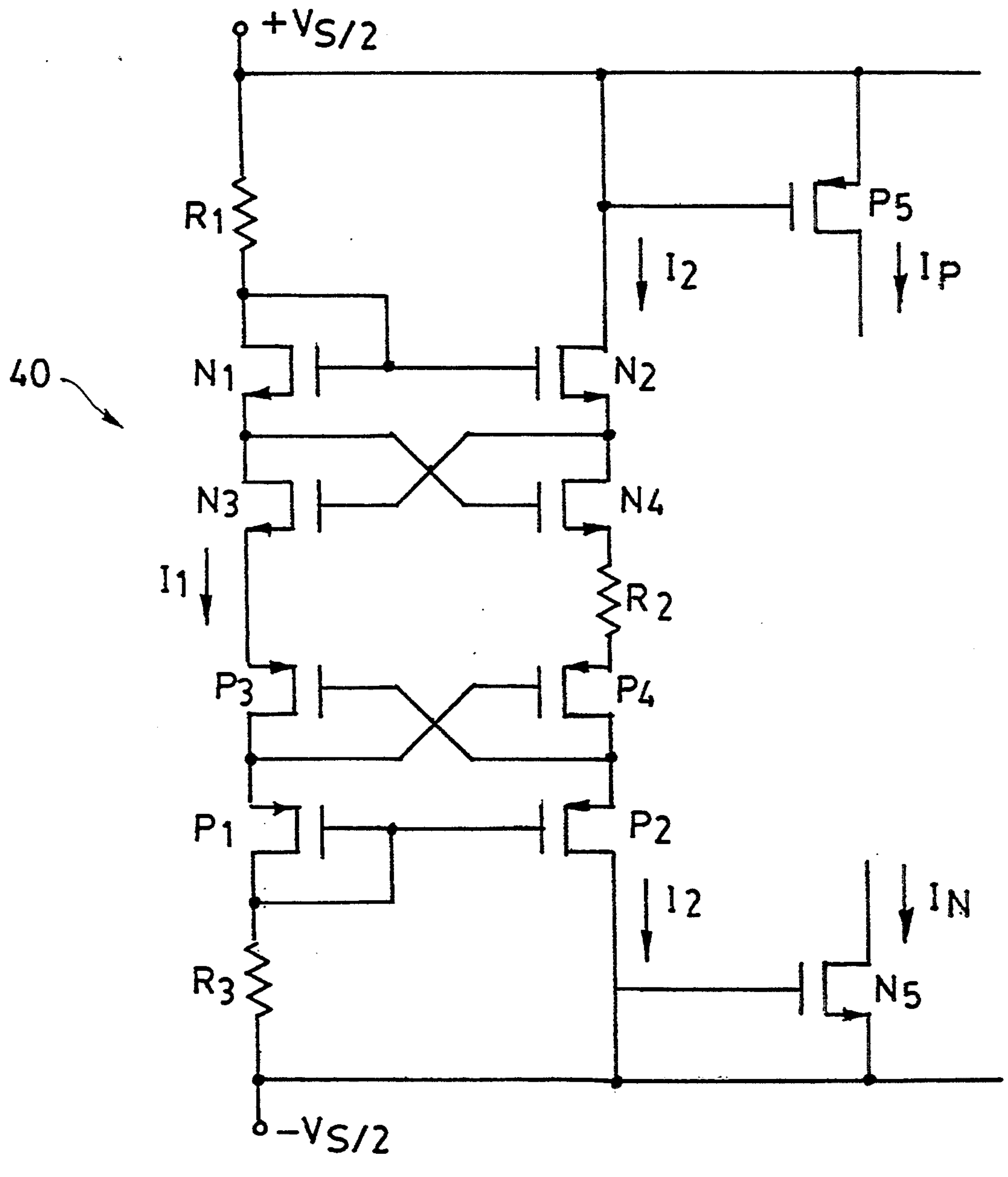
FIG. 4 shows a symmetrical mos current source.

With reference to FIG. 4, there is shown a metal oxide semiconductor symmetrical current source 40. Those skilled in the art will appreciate that the arrangement of the nmos and pmos transistors in the circuit 40 generally corresponds, respectively, to the arrangement of the npn and pnp transistors in FIG. 3. The following derivation will show that the current $I_2$ that flows in transistors N2, N4 resistor R2 and transistors P4, P2 is essentially independent of the current $I_1$ that flows in the left-hand side of the circuit through resistor R1, transistors N1, N3, P3, P1 and R3.

It is assumed that the circuit of FIG. 40 operates in the saturated region. As such, the drain to source current of all of the transistors is given by the following equation:

EQ 9:

$$IDS=\frac{KW}{l}=(V_{GS}-V_T)^2$$

If equation 8 is solved for the gate to source voltage, then the gate to source voltage is as follows:

EQ 10:

$$V_{GS}=\sqrt{\frac{I_{DS}l}{KW}}+V_T$$

If it is further assumed to let some of the terms in the radical equal a constant, for example equation 11:

EQ 11:

$$k = \frac{k'W}{l}$$

and through design techniques, the k value of the nmos transistors and the pmos transistors can all be rendered the same by choosing appropriate widths (W) and lengths (l) then the following voltage equation can be written for the closed loop path from transistor N1 to N4 through resistor R2, transistor P4 and P1 will equal the voltage drop across transistor N2, N3, P3 and P2. In other words: EQ 12:

$$V_{GSN1}+V_{GSN4}+I_2R_2+V_{GSP4}+V_{GSP1}=V_{GSN2}+V_{GSN3}+V_{GSP3}+V_{GSP2}$$

Substituting equation 10 into equation 12 yields the following:

EQ 13:

$$\sqrt{\frac{I_1}{k}} + V_{TN1} + \sqrt{\frac{I_2}{nk}} + V_{TN4} + I_2R2 + \sqrt{\frac{I_2}{nk}} + V_{TP4} + \sqrt{\frac{I_1}{k}} + V_{TP1} = \sqrt{\frac{I_2}{k}} + V_{TN2} + \sqrt{\frac{I_1}{k}} + V_{TN3} + \sqrt{\frac{I_1}{k}} + V_{TP3} + \sqrt{\frac{I_2}{k}} + V_{TP2}$$

It is also known that the threshold voltage $V_T$ of the nmos transistors can all be made the same and in a similar manner the threshold voltage of the pmos transistors can all be made the same. As such, the following relationship is subject to well-known process implementation techniques of setting threshold for different transistors: EQ 14:

$$V_{TN1}=V_{TN2}=V_{TN3}=V_{TN4}$$
$$V_{TP1}=V_{TP2}=V_{TP3}\leqq V_{TP4}$$

By substituting the results of equation 14 into equation 13, the result is as follows:

EQ 15:

$$I_2R_2 + 2\sqrt{\frac{I_2}{nk}} = 2\sqrt{\frac{I_2}{k}}$$

Further substitution and simplification yields the following results:

EQ 16:

$$I_2R_2 = 2\sqrt{\frac{I_2}{k}} - 2\sqrt{\frac{I_2}{nk}}$$

EQ 17:

-continued $$I_2R_2 = 2\sqrt{\frac{I_2}{k}}\left(1 - \frac{1}{\sqrt{n}}\right)$$

EQ 18:

$$I_2^2R_2^2 = 4\frac{I_2}{k}\left(1 - \frac{1}{\sqrt{n}}\right)^2$$

EQ 19:

$$I_2 = \frac{4}{R_2^2k}\left(1 - \frac{1}{\sqrt{n}}\right)^2$$

As such, the current $I_2$ is wholly independent of the power supplies and of the $I_1$.

Those skilled in the art will appreciate that the bipolar version of the invention shown in FIG. 3 will result in very small or almost negligible differences between the currents $I_n$ and $I_p$. The differences between the currents $I_n$ and $I_p$ and will be dependent upon only the value of alpha squared. As such, the bipolar as well as the mos version have excellent power supply rejection and are capable of operation at small power supply voltages. Both versions of the invention substantially simplify the integrated circuit layout to implement a current source. They also provide a bias current for the current sources that is independent of the reference current. Both versions can be designed to be relatively insensitive to temperature variations.

Having thus described the preferred embodiments of the disclosed invention, those skilled in the art will appreciate that further modifications, additions, changes, and deletions may be made from those embodiments without departing from the spirit and scope of the invention as set forth in the following claims:

What is claimed is:

1. A symmetrical current source comprising:

first and second npn transistors configured as a first transistor current source;

third and fourth npn cross coupled transistors connected to said first transistor current source to bias said first transistor current source at a first predetermined voltage;

first and second pnp transistors configured as a second transistor current source;

third and fourth cross coupled pnp transistors connected to said second current source and to said third and fourth cross coupled npn transistors to bias said second transistor current source at a second predetermined voltage.

2. The current source of claim 1 further comprising a positive reference voltage source coupled to said first transistor current source and a negative voltage reference source coupled to said second transistor current source.

3. The current source of claim 2 further comprising a first resistor coupled between the emitters of the fourth npn transistor and the fourth pnp transistor.

4. The current source of claim 3 further comprising second and third resistors coupled respectively between the first transistor current source and the positive voltage source and between the second transistor current source and the negative reference voltage source.

5. The current source of claim 4 wherein the second resistor is coupled between the positive reference voltage source and the first npn transistor and the third resistor is coupled between the first pnp transistor and the negative reference voltage source.

6. The current source of claim 2 further comprising a fifth pnp transistor coupled between the positive reference voltage source and the collector of the second npn transistor and a fifth npn transistor coupled between the negative reference voltage source and the emitter of the second pnp transistor of the second current source.

7. The current source of claim 6 wherein the bases of the respective fifth pnp and npn transistor are connected to the respective collectors of the second npn and second pnp transistors.

8. The current source of claim 6 further comprising first and second diodes, said first diode coupled between the positive reference voltage source and the second npn transistor of the first current source and the second diode coupled between the negative reference voltage source and the second pnp transistor of the second current source.

9. The current source of claim 8 wherein the first and second diodes are respectively coupled to the collectors of the second npn and second pnp transistors and to the respective bases of the fifth pnp and fifth npn transistors.

10. A symmetrical current source comprising:

first and second nmos transistors configured to provide a first transistor current source;

third and fourth nmos cross coupled transistors connected to said first transistor current source to bias said first transistor current source at a first predetermined voltage;

first and second pmos transistors configured to provide a second transistor current source;

third and fourth cross coupled pmos transistors connected to said second transistor current source and to said third and fourth cross coupled nmos transistors to bias said second transistor current source at a second predetermined voltage.

11. The current source of claim 10 further comprising a positive reference voltage source coupled to said first transistor current source and a negative voltage reference source coupled to said second transistor current source.

12. The current source of claim 11 further comprising a first resistor coupled between the fourth nmos transistor and the fourth pmos transistor.

13. The current source of claim 12 further comprising second and third resistors coupled respectively between the first transistor current source and the positive voltage source and between the second transistor current source and the negative reference voltage source.

14. The current source of claim 13 wherein the second resistor is coupled between the positive reference voltage source and the first transistor of the first current source and the third resistor is coupled between the first transistor of the second current source and the negative reference voltage source.

15. The current source of claim 11 further comprising a fifth nmos transistor coupled between the positive reference voltage source and the second nmos transistor and a fifth pmos transistor coupled between the negative reference voltage source and the second pmos transistor.

16. The current source of claim 15 wherein the gates of the respective fifth nmos and fifth pmos transistor are connected to the respective drains of the second nmos and second pmos transistors.

17. The current source of claim 1 wherein the first and second pnp transistors and the first and second npn transistors are respectively each configured to have their bases coupled to each other and the collector of the first pnp transistor is coupled to the base of the first pnp transistor and the collector of the first npn transistor is coupled to the base of the first npn transistor.

18. The current source of claim 1 wherein the second and third pnp transistors and the second and third npn transistors are cross coupled between their respective bases and collectors.

19. The current source of claim 10 wherein the first and second nmos and first and second pmos transistors are each configured to have their respective gates connected together and the drain of the first transistors is coupled to their gates.

20. The current source of claim 10 wherein the second and third nmos transistors and the second and third pmos transistors are respectively cross coupled between their respective gates and sources.

* * * * *